United States Patent [19]

Selim

[11] Patent Number: 4,641,101
[45] Date of Patent: Feb. 3, 1987

[54] WIDEBAND, MICROWAVE REGENERATIVE DIVIDER WITH VARACTOR TUNING

[75] Inventor: Harold N. Selim, Wichita, Kans.

[73] Assignee: IFR, Inc., Wichita, Kans.

[21] Appl. No.: 664,556

[22] Filed: Oct. 25, 1984

[51] Int. Cl.[4] .................... H03B 19/05; H03L 7/00
[52] U.S. Cl. ...................................... 328/25; 307/271
[58] Field of Search ................... 331/74, 77, 177 V; 307/271; 328/25, 30; 363/158; 377/47

[56] References Cited

U.S. PATENT DOCUMENTS

| | | | |
|---|---|---|---|
| 2,159,597 | 5/1939 | Miller | 332/47 X |
| 2,926,244 | 2/1960 | Stryker, Jr. | 250/27 |
| 2,944,205 | 7/1960 | Keizer et al. | 321/69 |
| 3,110,820 | 11/1963 | Panicello | 328/30 X |
| 3,140,447 | 7/1964 | Olbrych et al. | 328/15 |
| 3,316,478 | 4/1967 | Polaniecki | 321/65 |
| 3,358,215 | 12/1967 | Swan | 321/69 |
| 3,662,287 | 5/1972 | Egbert et al. | 331/117 |
| 3,997,796 | 12/1976 | Sanders et al. | 307/220 R |
| 4,152,680 | 5/1979 | Harrison | 333/246 |
| 4,357,580 | 11/1982 | Mawhinney | 331/1 R |

OTHER PUBLICATIONS

Fractional-Frequency Generators Utilizing Regenerative Modulation, R. L. Miller, Proceedings of the IRE, vol. 27, pp. 446–456, Jul. 1939.
Study and Fabrication of a Frequency Divider-Multiplier Scheme for High Efficiency Microwave Power, S. V. Ahamed et al., IEE Trans. on Com., vol. COM-24, No. 2, pp. 243–249, Feb. 1976.
Parametric Phase-Locked Oscillator-Characteristics and Applications to Digital Systems, L. S. Onyshkevych et al., IRE Trans. on Electronic Computers, vol. EC-8, No. 3, pp. 277–286, Sep. 1959.

Primary Examiner—Eugene R. LaRoche
Assistant Examiner—Robert J. Pascal
Attorney, Agent, or Firm—Woodard, Weikart, Emhardt & Naughton

[57] ABSTRACT

A wideband, microwave regenerative divider with varactor tuning in which a double-balanced mixer is incorporated in a feedback loop with a varactor-tuned filter and an RF amplifier in the forward loop, with the RF amplifier output fed directly back to the mixer. A series resonant circuit formed by two serially connected back-to-back varactors interconnected by an inductor is tuned by application of a DC tuning voltage to a center tap of the inductor. In the preferred embodiment two regenerative dividers are connected in series in a YIG oscillator system which includes a programmable tuning circuit connected between the VCO tuning signal input for the YIG oscillator and the tuning voltage inputs of the respective regenerative dividers.

15 Claims, 3 Drawing Figures

WIDEBAND, MICROWAVE REGENERATIVE DIVIDER WITH VARACTOR TUNING

BACKGROUND OF THE INVENTION

This invention relates to regenerative dividers, and particularly to wideband, microwave regenerative dividers.

High-speed frequency dividers are often used as prescalers in phase-locked loop frequency synthesizers to reduce the output frequency of a voltage-controlled oscillator (VCO) to a frequency within the frequency range of conventional solid-state counters. A phase-locked loop can thus be constructed using counters which cannot operate at the frequency of operation of the VCO. For many applications direct division using emitter-coupled logic (ECL) is feasible. However, ECL has an upper frequency limit of approximately 1 GHz. Regenerative dividers are operable beyond this range.

In one regenerative divider configuration, described by R. L. Miller in "Fractional-Frequency Generators Utilizing Regenerative Modulation," Proceedings of the IRE. Vol. 27, pp. 446-456, July, 1939, the output of a balanced modulator is serially connected to a filter network and an amplifier in the forward path of a feedback loop. One input of the modulator is the divider input, and the amplifier output is fed back to the second input of the modulator. The filter network is tuned to half the input frequency. At steady state, the amplifier output frequency is half the input frequency, and the difference frequency generated by the modulator is filtered and amplified to reinforce the output frequency.

A regenerative divide-by-two circuit of this type which has been used with an input frequency of 3990 MHz is described by S. V. Ahamed et al. in "Study and Fabrication of a Frequency Divider-Multiplier Scheme for High-Efficiency Microwave Power," IEE Transactions on Communications, Vol. COM-24, No. 2, pp. 243-9, February, 1976. This circuit is part of an 8.2 W, microwave FM power amplifier for the 4 GHz band which operates on a frequency divide, amplify, and multiply scheme.

Harrison, in U.S. Pat. No. 4,152,680, shows a broadband frequency divider using microwave varactors interconnected with microstrip or stripline transmission lines to form a resonant circuit which supports oscillation at one-half the input signal frequency. In the embodiment shown in FIG. 8, the resonant frequency of the device varies as a function of the reverse DC bias applied to two varactors by way of pads 36 and 40. The divider operates open-loop.

Onyshkevych, Kosonocky and Lo described a varactor diode subharmonic generator, with contemplated applications in computer logic and memory, which reportedly operated at 2-4 GHz. This subharmonic generator is reported in "Parametric Phase-Locked Oscillator - Characteristics and Applications to Digital Systems," IRE Transactions on Electronic Computers, Volume EC-8, No. 3, September 1959, pp. 277-286.

A single-tuned regenerative frequency divider employing a tuned circuit in a feedback loop constructed around a mixer amplifier is shown in U.S. Pat. No. 2,926,244 to Stryker. The tuned circuit, which is an LC tank circuit, is tuned to a fixed frequency. This divider circuit includes a rectifier-multiplier in the feedback path.

A similar divider, using a mixer with its output connected to a tank circuit, is shown in U.S. Pat. No. 3,140,447 to Olbrych. This divider also includes a frequency multiplier and a second tank circuit in the feedback path.

Polaniecki, in U.S. Pat. No. 3,316,478, shows a regenerative frequency changer with a diode mixer having an input connected to the frequency changer output through a frequency multiplier comprising a DC blocking capacitor and a varactor diode. The varactor in this circuit is used for frequency multiplication rather than filtering.

U.S. Pat. No. 2,944,205 to Keizer et al. shows another frequency divider employing a varactor and, in one embodiment shown in FIG. 7, shows a source of bias voltage for starting the operation of the frequency divider.

Egbert et al., in U.S. Pat. No. 3,662,287, shows a voltage-controlled oscillator multiplier in which a single varactor tunes an oscillator and produces frequency multiplication. An adjustable battery source is employed. Other high-speed divider circuits are shown in U.S. Pat. Nos. 3,997,796 to Sanders et al. and 4,357,580 to Mawhinney.

U.S. Pat. No. 3,358,215 to Swan shows a frequency doubler circuit using a varactor in the feedback path of a closed loop to generate harmonics of the input frequency to the doubler. All frequencies but the desired output frequency are filtered out by RC bandstop filters. A fixed source of varactor bias voltage is shown.

SUMMARY OF THE INVENTION

The present invention provides a wideband, microwave regenerative divider with varactor tuning comprising a source of RF capable of producing RF signals at different frequencies above about 1 GHz, a mixer having one input coupled to the RF source and an output coupled to a varactor-tuned filter provided with means for tuning to a subharmonic of the frequencies of the RF signals, the filter having an output coupled to a second mixer input, and a tuning voltage input.

According to another aspect of the invention, a wideband, microwave oscillator employs a regenerative divider with varactor tuning and comprises a wideband, microwave VCO having a tuning signal input and an output connected to a first input of a mixer, with an output of the mixer being coupled to a varactor-tuned filter having its output coupled to a second input of the mixer and further having a tuning voltage input, the invention further comprising tuning means coupled to the VCO tuning signal input and to the filter tuning voltage input for tuning the filter to a frequency of approximately half the output frequency of the VCO.

A general object of the invention is to provide an improved regenerative divider.

Another object of the invention is to provide a regenerative divider operative over a wide band of microwave frequencies.

Another object of the invention is to provide a wideband, microwave regenerative divider with a varactor-tuned filter the tuning of which is adjusted to maintain the divider output at approximately half the VCO output frequency as the VCO output frequency varies.

DESCRIPTION OF THE PREFERRED EMBODIMENT

Figure 1:
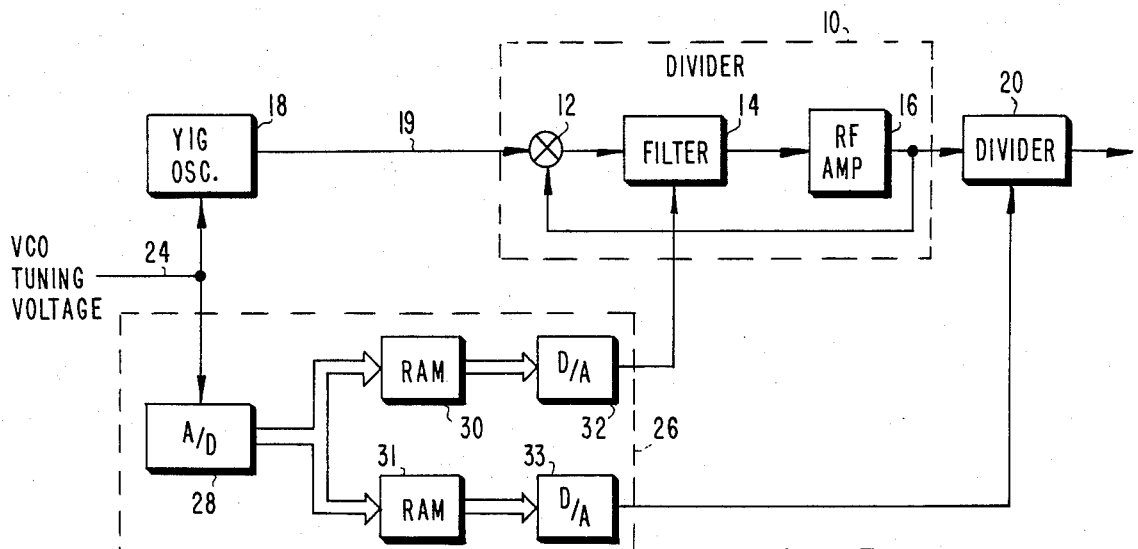
FIG. 1 is a block diagram representation of the preferred embodiment of a regenerative divider according to the present invention, in an operating environment in an oscillator circuit.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

With reference to FIG. 1, a YIG RF system employing the preferred embodiment of a regenerative divider according to the present invention is shown in block diagram form. Regenerative divider 10, shown inside dotted lines in FIG. 1, includes a mixer 12, a filter 14, and an RF amplifier 16 arranged to form a closed feedback loop with the output of RF amp 16 being coupled directly back to an input of mixer 12. The input to regenerative divider 10 is an RF signal supplied by YIG oscillator 18 and coupled along line 19 into one input of mixer 12. In the specific exemplary embodiment described herein, YIG oscillator 18 generates RF signals at frequencies from 2.3–4.3 GHz, about one octave, and divider 10 divides the input frequency by two. Alternatively, the oscillator may be configured to generate microwave signals, i.e., RF signals at frequencies above about 1 GHz, in other frequency bands, including bands of more than one octave. The preferred embodiment employs two dividers connected in series, as shown in FIG. 1, thereby reducing the output frequency range such that the maximum output frequency is approximately 1 GHz. At this frequency, and below, standard circuits may be used to count or control the frequency of the YIG oscillator. The output of regenerative divider 10 is supplied to a second divider 20, which has the same configuration as that shown in FIG. 1 for regenerative divider 10.

YIG oscillator 18 is a wideband, microwave VCO the output frequency of which is controlled by a VCO tuning voltage supplied thereto along input line 24. As used herein, the term VCO denotes an electronically controlled frequency oscillator, whether controlled by voltage or current. Filter 14 is a bandpass filter which includes varactors tuned for a center frequency of approximately half the frequency of the input signal supplied on line 19 to mixer 12. The varactors in filter 14 are tuned from the same tuning source used to tune YIG oscillator 18, through a programmable tuning circuit 26 coupled to VCO tuning voltage input line 24. Programmable tuner 26 has individual output lines for regenerative dividers 10 and 20 for individual control thereof.

Programmable tuner 26 generates tuning voltages for the two dividers based on quantized values of the VCO tuning voltage supplied to YIG oscillator 18 and on values stored in random-access memory representative of the individual divider tuning curves. Analog-to-digital (A/D) converter 28 converts the VCO tuning voltage to a digital value and supplies that digital value to the address inputs of RAMs 30 and 31, which have their data outputs connected, respectively, to digital-to-analog (D/A) converters 32 and 33, which are in turn connected, respectively, to the tuning voltage inputs of dividers 10 and 20. RAM 30 is programmed with digital divider tuning voltage data corresponding to the tuning curve of filter 14 in divider 10, and RAM 31 is similarly programmed with tuning voltage data for divider 20. Enough data values are stored in memory to cause the dividers to follow the YIG oscillator sufficiently close as to operate over the entire oscillator range. In the preferred embodiment, the VCO tuning voltage range is quantized into sixteen steps, and sixteen corresponding divider tuning voltage values are accordingly stored in each RAM, although it is to be understood that more or fewer steps may be used as desired to fulfill particular performance criteria. One alternative embodiment employs eight steps, and adequate operation is possible with as few as three or four steps. The values from the divider tuning curves are represented as eight-bit words in memory, and accordingly D/A converters 32 and 33 are capable of eight-bit conversion. Alternatively, words of fewer bits, for example, six bits, may be employed. A/D and D/A converters and RAMs having the features just described are readily available from a number of integrated-circuit suppliers. The programmable tuner further includes a keep-alive battery (not shown) for maintaining the contents of each RAM intact in the case of a power failure.

Figure 2:
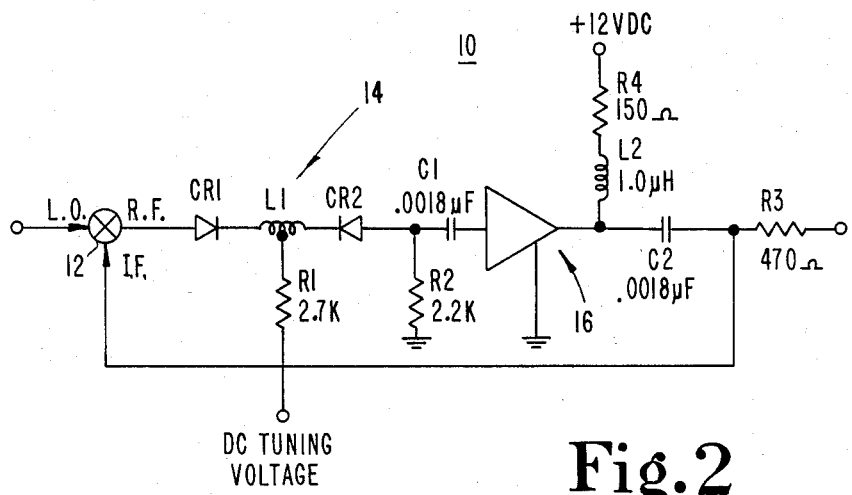
FIG. 2 is a schematic representation of the preferred embodiment of a regenerative divider according to the present invention.

Referring now to FIG. 2, the detailed circuitry for regenerative divider 10 is shown in schematic form. The detailed circuitry for regenerative divider 20 is somewhat simplified in comparison with that for divider 10, as will be described. Mixer 12 is coupled to filter 14 and therethrough to RF amplifier 16 in the forward loop, and a unity feedback path is provided to mixer 12. The input to divider 10 is supplied to the LO input of mixer 12. The RF output of mixer 12 is coupled to filter 14, and the IF input of the mixer is connected to the output of RF amp 16.

The preferred embodiment of filter 14 includes two varactors, CR1 and CR2, serially connected in back-to-back fashion and interconnected by an inductor L1 to form a series resonant circuit. Other resonant circuit configurations are also suitable, including, for example, parallel resonant filters and $\pi$ (pi) filters. Inductor L1 is provided with a center tap connected through a resistor R1 to the DC tuning voltage input of divider 10. The anode of varactor CR2 is coupled through a DC blocking capacitor C1 to the input of RF amp 16 and also through resistor R2 to ground. R2 provides a DC current path for current flowing through CR2. Another DC blocking capacitor C2 is employed to AC-couple the output of RF amp 16 both to the IF input of mixer 12 and to the output of the divider. R3 is included to provide and output impedance of 470 ohms for the divider.

Mixer 12 is a double-balanced mixer capable of 800–4000 MHz operation and having 50 ohms nominal input impedance. A mixer of this type is manufactured by Anzac Division of Adams Russell, 80 Cambridge Street, Burlington, Mass. 01803 and designated MD-157. The invention is not intended to be restricted to double-balanced mixers; other types of mixers may be alternatively employed, including single-balanced mixers. Varactors CR1 and CR2 and 60-volt silicon tuning varactors available from GHZ Devices, 16 Maple Road, Chelmsford, Mass. 01824 as part number GC- 1700A. The preferred amplifier for RF amp 16 is Avantek type MSA-0335-22. Resistor R4 and inductor L2 are connected between a source of +12 volts DC and the output of RF amp 16 to provide external bias to the RF amplifier. L1 is wound from 1.5 inches of No. 22 bus wire.

In steady-state operation, divider 10 operates with a frequency $f_{in}$ at the L.O. input of mixer 12 and an output frequency $f_{in}/2$. The input and output frequencies are mixed in mixer 12, which generates sum and difference frequencies including $f_{in}/2$ as well as several higher-order harmonics thereof. Varactors CR1 and CR2 are tuned for resonance with L1 at the difference frequency $f_{in}/2$ by application of a proper DC voltage to the DC tuning voltage input. Filter 14 filters out all other frequencies generated by mixer 12. The filter output signal is amplified by RF amp 16 before being supplied to the divider output.

For maximum loop stability, the gain of amplifier 16 preferably exceeds the sum of the mixer conversion loss and the filter insertion loss by approximately 3-7 db. As an illustration of gain figures using the devices described above which would provide stable loop operation, mixer 12 could operate with 7 db conversion loss, the filter loss could be 1 db, and the gain in amplifier 16 could be 12 db, the typical value for the amplifier model described above. The loop optimally operates with a phase relationship in which the signal fed back to the I.F. terminal of mixer 12 leads the signal on the R.F. terminal by approximately 90°; amplifier 16 provides 90° of phase lead, and filter 14, being a resonant circuit, contributes zero phase shift. However, the mixer phase relationship can be allowed to vary by at least ±45° without substantially affecting loop stability. Also, filter 14 may be detuned to provide a desired phase shift. Amplifier 16 exhibits a varying phase shift with frequency, typical values of which are 146° phase lead at 1 GHz and 115° phase lead at 2 GHz. If, for example, the desired divider output frequency is 1 GHz, filter 14 may be tuned slightly off 1 GHz to cause it to provide phase lag of 11° or more so as to offset the 146° phase lead in the amplifier sufficiently that mixer 12 operates with I.F. and R.F. signals which are out of phase with each other by no greater than 135°. It will be understood that phase lags are also associated with component and printed circuit leads of finite length; these phase lags tend to compensate for amplifier phase lead as well. It will be further understood that the mixer phase relationship may be allowed to vary, or the filter may be detuned to various degrees, for any given frequency. The use of this technique provides stable divider operation at all frequencies of interest.

Figure 3:
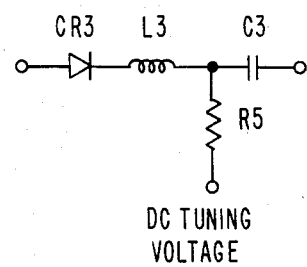
FIG. 3 is a schematic representation of the preferred embodiment of a filter for a second regenerative divider.

Since divider 20 operates at half the frequency of divider 10, the filter may be simplified as shown in FIG. 3. One varactor CR3 provides the larger capacitance value desired at the operating frequency of divider 20. Similarly, L3 is wound from twice the length of wire as L1 in order to obtain a lower center frequency. The DC tuning voltage is fed through R5 to one end of L3 rather than to a center tap. C3 is a blocking capacitor. Since only one varactor is employed, divider 20 has no equivalent of R2 (FIG. 2). The same type of mixer and RF amplifier as described above for divider 10 are also suitable for divider 20. Alternatively, any mixer capable of operating at approximately 2 GHz, and any RF amplifier capable of operating at approximately 1 GHz, of which there exist various commercially available versions, may be employed.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A wideband microwave regenerative divider with varactor tuning, comprising:
    (a) a source of RF capable of producing RF signals at different frequencies above about 1 GHz;
    (b) a mixer having first and second inputs and an output, said first input being coupled to said source; and
    (c) a varactor-tuned filter with means for tuning to a subharmonic of the frequencies of said RF signals, said filter having a varactor and inductor connected together between said mixer output and said second mixer input, and a tuning voltage input connected to said varactor.

2. The regenerative divider of claim 1 further comprising:
    (d) an RF amplifier interposed between said filter output and said second mixer input.

3. The regenerative divider of claim 2 in which said RF amplifier is directly coupled to said second mixer input.

4. The regenerative divider of claim 3 in which said filter includes means for tuning to one-half the frequency of each of said RF signals whereby said divider divides by 2.

5. The regenerative divider of claim 4 in which said divider is operative over about a full octave above approximately 2 GHz.

6. A wideband, microwave regenerative divider with varactor tuning, comprising:
    (a) a source of RF capable of producing RF signals at different frequencies above about 1 GHz;
    (b) a mixer having first and second inputs and an output, said first input being coupled to said source;
    (c) a varactor-tuned filter with means for tuning to a subharmonic of the frequencies of said RF signals, said filter having an input coupled to said mixer output, an output coupled to said second mixer input, and a tuning voltage input; and
    (d) an RF amplifier interposed between said filter output and said second mixer input,
    in which said RF amplifier is directly coupled to said second mixer input, said filter includes means for tuning to one-half the frequency of each of said RF signals whereby said divider divides by 2, said divider is operative over about a full octave above approximately 2 GHz, and in which said filter further includes first and second varactors interconnected at their cathodes by an inductor and having their anodes connected respectively to said filter input and said filter output, said inductor having a center tap connected to said tuning voltage input.

7. The regenerative divider of claim 6 in which said RF signals are generated by a VCO at frequencies determined by a VCO tuning voltage, further comprising:
    (e) means responsive to the VCO tuning voltage for supplying a divider tuning voltage to said tuning voltage input of said filter.

8. The regenerative divider of claim 1 in which said divider is operative over about a full octave above approximately 2 GHz.

9. A wideband, microwave regenerative divider with varactor tuning, comprising:
 (a) a source of RF capable of producing RF signals at different frequencies above about 1 GHz;
 (b) a mixer having first and second inputs and an output, said first input being coupled to said source; and
 (c) a varactor-tuned filter with means for tuning to a subharmonic of the frequencies of said RF signals, said filter having an input coupled to said mixer output, an output coupled to said second mixer input, and a tuning voltage input,
 in which said filter further includes first and second varactors interconnected at their cathodes by an inductor and having their anodes connected respectively to said filter input and said filter output, said inductor having a center tap connected to said tuning voltage input.

10. The regenerative divider of claim 1 in which said RF signals are generated by a VCO at frequencies determined by a VCO tuning voltage, further comprising:
 (e) means responsive to the VCO tuning voltage for supplying a divider tuning voltage to said tuning voltage input of said filter.

11. A wideband, microwave oscillator employing a rengerative divider with varactor tuning, comprising:
 (a) a wideband, microwave VCO, said VCO having a tuning signal input and an output;
 (b) a mixer having first and second inputs and an output, said first input being coupled to said VCO output;
 (c) an electronically tuned filter having a varactor and inductor connected together between said mixer output and said second mixer input, and a tuning voltage input connected to said varactor; and
 (d) tuning means coupled to said VCO tuning signal input and said filter tuning voltage input for tuning said filter to a frequency of approximately half the output frequency of said VCO.

12. The oscillator of claim 11 in which said divider is operative over about a full octave above approximately 2 GHz.

13. A wideband, microwave oscillator employing a regenerative divider with varactor tuning, comprising:
 (a) a wideband, microwave VCO, said VCO having a tuning signal input and an output;
 (b) a mixer having first and second inputs and an output, said first input being coupled to said VCO output;
 (c) an electronically tuned filter having an input coupled to said mixer output, an output coupled to said second mixer input, and a tuning voltage input; and
 (d) tuning means coupled to said VCO tuning signal input and said filter tuning voltage input for tuning said filter to a frequency of approximately half the output frequency of said VCO,
 in which said divider is operative over about a full octave above approximately 2 GHz, and in which said filter further includes first and second varactors interconnected at their cathodes by an inductor and having their anodes connected respectively to said filter input and said filter output, said inductor having a center tap connected to said tuning voltage input.

14. A wideband, microwave regenerative divider with varactor tuning, comprising:
 (a) a double-balanced mixer having first and second inputs and an output;
 (b) a varactor having first and second leads, said first varactor lead being connected to said mixer output;
 (c) an inductor having first and second leads, said first inductor lead being connected to said second varactor lead;
 (d) an RF amplifier having an input connected to said second inductor lead and an output connected to said second mixer input; and
 (e) means coupled to said inductor for supplying a bias voltage to said varactor.

15. The regenerative divider of claim 14 in which said first and second varactor leads are the anode and cathode, respectively, of said varactor; said inductor includes a center tap; and in which said supplying means includes a resistor connected to said center tap, said divider further comprising:
 a second varactor interposed between said inductor and said RF amplifier, said second varactor having a cathode connected to said second inductor lead and an anode connected to said RF amplifier input.

* * * * *